US009209105B2

(12) United States Patent
Nguyen et al.

(10) Patent No.: US 9,209,105 B2
(45) Date of Patent: *Dec. 8, 2015

(54) ELECTRONIC DEVICES ASSEMBLED WITH THERMALLY INSULATING LAYERS

(71) Applicants: Henkel IP & Holding GmbH, Duesseldorf (DE); Henkel AG & Co. KGaA, Duesseldorf (DE)

(72) Inventors: My Nhu Nguyen, Poway, CA (US); Emilie Barriau, Duesseldorf (DE); Martin Renkel, Duesseldorf (DE); Matthew J. Holloway, Naas (IE); Jason Brandi, Laguna Hills, CA (US)

(73) Assignee: Henkel IP & Holding GmbH, Duesseldorf (DE)

(*) Notice: Subject to any disclaimer, the term of this patent is extended or adjusted under 35 U.S.C. 154(b) by 0 days.

This patent is subject to a terminal disclaimer.

(21) Appl. No.: 14/267,579

(22) Filed: May 1, 2014

(65) Prior Publication Data

US 2014/0239481 A1 Aug. 28, 2014

Related U.S. Application Data

(63) Continuation of application No. PCT/US2012/064422, filed on Nov. 9, 2012.

(60) Provisional application No. 61/559,989, filed on Nov. 15, 2011.

(51) Int. Cl.
*H01L 23/48* (2006.01)
*H01L 23/36* (2006.01)
*G06F 1/20* (2006.01)

(52) U.S. Cl.
CPC ........ *H01L 23/36* (2013.01); *G06F 1/20* (2013.01); *H01L 2924/0002* (2013.01)

(58) Field of Classification Search
USPC .............................. 257/772, 774, E23.01, 434
See application file for complete search history.

(56) References Cited

U.S. PATENT DOCUMENTS

| | | | |
|---|---|---|---|
| 4,979,019 A | 12/1990 | Paquette et al. |
| 6,166,908 A | 12/2000 | Samaras et al. |
| 6,292,365 B1 | 9/2001 | Ashiwake et al. |
| 6,482,520 B1 | 11/2002 | Tzeng |
| 6,583,987 B2 | 6/2003 | Skinner et al. |
| 6,982,874 B2 | 1/2006 | Smalc et al. |
| 7,643,284 B2 | 1/2010 | Nakamura |
| 7,969,738 B2 | 6/2011 | Koo |
| 8,003,028 B2 | 8/2011 | Lawton |
| 8,242,602 B2 | 8/2012 | Fitzgerald et al. |

(Continued)

FOREIGN PATENT DOCUMENTS

| | | |
|---|---|---|
| EP | 2259164 | 12/2010 |
| JP | 2000-148306 | 5/2000 |

(Continued)

OTHER PUBLICATIONS

International Search Report for PCT/US2012/064422, 1 page.

(Continued)

*Primary Examiner* — Matthew W Such
*Assistant Examiner* — Krista Soderholm
(74) *Attorney, Agent, or Firm* — Steven C. Bauman

(57) ABSTRACT

Provided herein are electronic devices assembled with thermally insulating layers.

20 Claims, 4 Drawing Sheets

(56) References Cited

U.S. PATENT DOCUMENTS

| | | | |
|---|---|---|---|
| 8,296,942 B2 | 10/2012 | Feenstra | |
| 8,349,920 B2 | 1/2013 | Menning | |
| 8,391,065 B2 | 3/2013 | Noguchi | |
| 8,535,981 B2 * | 9/2013 | Ko et al. | 438/109 |
| 2001/0019745 A1 | 9/2001 | Beele et al. | |
| 2002/0050642 A1 * | 5/2002 | Oota et al. | 257/738 |
| 2002/0114134 A1 | 8/2002 | Skinner et al. | |
| 2003/0019604 A1 | 1/2003 | Ishiduka et al. | |
| 2003/0169568 A1 | 9/2003 | Tanaka | |
| 2003/0198022 A1 | 10/2003 | Ye et al. | |
| 2004/0056348 A1 | 3/2004 | Nakanishi et al. | |
| 2005/0030715 A1 | 2/2005 | Hirota et al. | |
| 2005/0214547 A1 | 9/2005 | Pasquier et al. | |
| 2006/0007656 A1 | 1/2006 | Symons | |
| 2006/0086493 A1 | 4/2006 | Fujiwara et al. | |
| 2007/0097651 A1 | 5/2007 | Canale et al. | |
| 2007/0176277 A1 | 8/2007 | Brunnbauer et al. | |
| 2007/0290392 A1 | 12/2007 | Lawton | |
| 2008/0053640 A1 | 3/2008 | Mok | |
| 2009/0001372 A1 | 1/2009 | Arik et al. | |
| 2009/0161300 A1 | 6/2009 | Chou | |
| 2009/0161311 A1 | 6/2009 | Tseng | |
| 2009/0180257 A1 | 7/2009 | Park et al. | |
| 2009/0283902 A1 | 11/2009 | Bezama et al. | |
| 2010/0002399 A1 | 1/2010 | Mori et al. | |
| 2010/0055811 A1 | 3/2010 | Lin et al. | |
| 2010/0227198 A1 | 9/2010 | Lampenscherf | |
| 2010/0245716 A1 | 9/2010 | Mo et al. | |
| 2010/0277868 A1 | 11/2010 | Beaupre et al. | |
| 2011/0044002 A1 | 2/2011 | Jokelainen et al. | |
| 2011/0044369 A1 | 2/2011 | Andry et al. | |
| 2011/0101349 A1 * | 5/2011 | Oda | 257/48 |
| 2011/0110048 A1 | 5/2011 | Lima | |
| 2011/0157832 A1 | 6/2011 | Hongo | |
| 2011/0176280 A1 | 7/2011 | Lee | |
| 2011/0316035 A1 | 12/2011 | Shin et al. | |
| 2012/0014068 A1 | 1/2012 | Nakanishi et al. | |
| 2012/0152297 A1 * | 6/2012 | Mitchell et al. | 136/205 |
| 2012/0153455 A1 | 6/2012 | Mizuno et al. | |
| 2012/0193076 A1 | 8/2012 | Sakamoto et al. | |
| 2012/0281360 A1 | 11/2012 | Nicol et al. | |
| 2012/0326292 A1 | 12/2012 | Ohashi et al. | |
| 2013/0058067 A1 * | 3/2013 | Yee et al. | 361/820 |
| 2014/0085911 A1 | 3/2014 | Zhang et al. | |

FOREIGN PATENT DOCUMENTS

| | | |
|---|---|---|
| JP | 2000194454 | 7/2000 |
| JP | 2001-142575 | 5/2001 |
| JP | 2003-027080 | 1/2003 |
| JP | 2004-241721 | 8/2004 |
| JP | 2008112225 | 5/2008 |
| JP | 2009-123769 | 6/2009 |
| KR | 1020080085995 | 9/2008 |
| KR | 101076128 | 10/2011 |
| KR | 101077378 | 10/2011 |
| KR | 101125702 | 3/2012 |
| WO | 2007133074 | 11/2007 |

OTHER PUBLICATIONS

Smalc, M. et al., "Thermal Performance of National Graphite Heat Spreaders", Proc. IPACK2005, Interpack 2005-73073 (Jul. 2005), pp. 1-11.

Houtman, C. et al., "Properties of Water-based Acrylic Pressure Sensitive Adhesive Films in Aqueous Environments", 2000TAPPI Recycling Symposium, Washington, D.C. (Mar. 5-8, 2000).

Satas, Donatas. "Handbook of Pressure Sensitive Adhesive Technology", Van Nostrand, NY (1989).

International Search Report issued in connection with International Patent Application No. PCT/US2014/027031 mailed Jul. 4, 2014.

* cited by examiner

ELECTRONIC DEVICES ASSEMBLED WITH THERMALLY INSULATING LAYERS

BACKGROUND

1. Field

Provided herein are electronic devices assembled with thermally insulating layers.

2. Brief Description of Related Technology

As microelectronic circuitry continues to shrink in size and the capacity of the circuitry in terms of functionality continues to increase, the heat generated by the circuitry when in use becomes more and more of a problem for manufacturers and end users. Put another way, the level of heat generated is related to the performance of the semiconductor package, with more highly performing devices generating greater levels of heat. For instance, the semiconductor packages assembled on the circuit board within the consumer electronic device, for instance, such as those found in central and graphics processing units, chipsets, battery and voltage regulators, all generate heat as a normal by-product of operation. The semiconductor packages generate heat that needs to be managed in order to increase the life of the package, minimize design limitations and increase performance of the package, and consequently the life and performance of the consumer electronic device.

Thermal management materials are well known for dissipating heat generated by the circuitry and fans placed at strategic locations within the electronic device also draws heat away from the circuitry, or thermal module. The excess heat is diverted away from the semiconductor package to a heat sink or the thermal module with a thermal interface material ("TIM"), oftentimes disposed between the semiconductor package and the heat sink or thermal module.

However, these strategies to manage generated heat have created new problems, as the hot air is directed away from the immediate environment of the semiconductor package toward the interior of the housing of the device.

More specifically, in a conventional laptop or notebook computer (shown in FIG. 2), a housing exists under which are the components below the keyboard (shown in FIG. 3). The components include a heat sink, a heat pipe (disposed above a CPU chip), a fan, a slot for the PCMIA card, a hard drive, a battery, and a bay for a DVD drive. The hard drive is disposed under the left palm rest and the battery under the right. Oftentimes, the hard drive operates at high temperatures, resulting in uncomfortable palm rest touch temperatures, despite the use of cooling components to dissipate this heat. This may lead to end user consumer discomfort due to hot temperatures attained at certain portions of the exterior of the device when the devices are used.

One solution to mute the high in use temperatures observed by the end user at the palm rest position, for instance, is to use natural graphite heat spreaders disposed at strategic locations. These heat spreaders are reported to distribute heat evenly while providing thermal insulation through the thickness of the material. One such graphite material is available commercially as eGraf® SpreaderShield™, from GrafTech Inc., Cleveland, Ohio. [See M. Smalc et al., "Thermal Performance Of Natural Graphite Heat Spreaders", Proc. IPACK2005, Interpack 2005-73073 (July, 2005); see also U.S. Pat. No. 6,482,520.]

Alternative solutions are desirable and would be advantageous, as there is a growing need in the marketplace for ways in which to manage the heat generated by such semiconductor packages used in electronic devices so that end user consumers do not feel discomfort due to the generated heat when they are used. Balanced against this need is the recognition that designers of semiconductor chips will continue to reduce the size and geometry of the semiconductor chips and semiconductor packages but increase their capacity, so as to make the electronic devices appealing for the consumer, but in so doing causing the semiconductor chips and semiconductor packages to continue to operate at elevated temperature conditions. Accordingly, it would be advantageous to satisfy this growing, unmet need, with alternative technologies to encourage the design and development of even more powerful consumer electronic devices, which are not hot to the touch in operation.

This need has been unmet. Until now.

SUMMARY

Provided herein is a consumer electronic article of manufacture comprising:

A housing comprising at least one substrate having an interior surface and an exterior surface;

A layer of thermally insulating elements disposed on at least a portion of the interior surface of the at least one substrate; and At least one semiconductor package comprising an assembly comprising at least one of I.
  a semiconductor chip;
  a heat spreader; and
  a thermal interface material therebetween (also known as a TIM1 application)

II.
  a heat spreader;
  a heat sink; and
  a thermal interface material therebetween (also known as a TIM2 application).

Also, provided herein is a method of manufacturing such a consumer electronic device.

DETAILED DESCRIPTION

Figure 1:
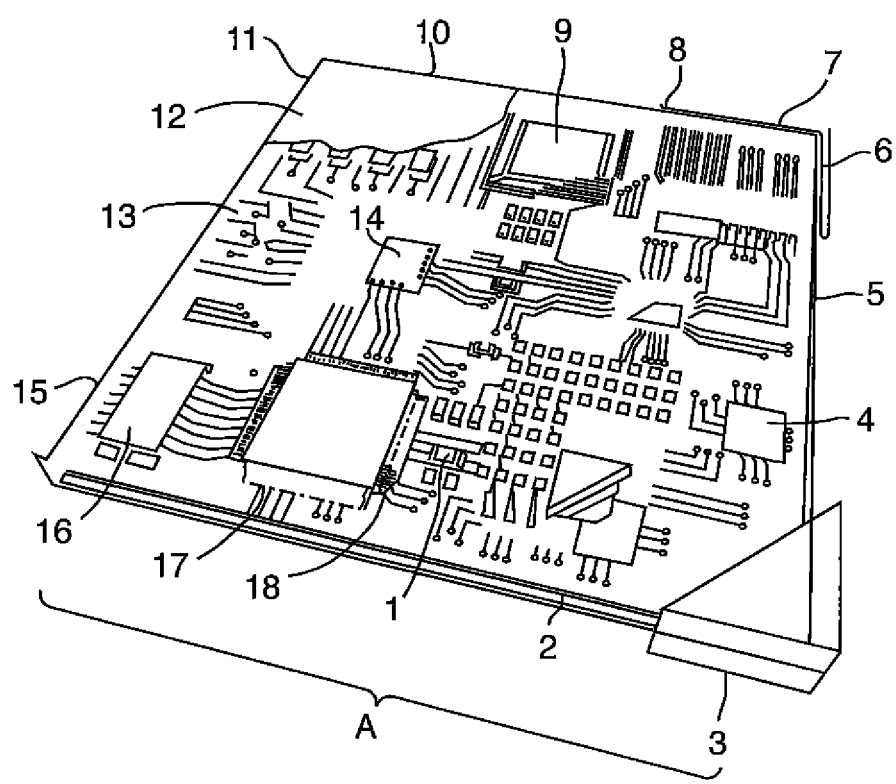
FIG. 1 depicts a cut away view of a circuit board on which is disposed a plurality of semiconductor packages and circuitry, together with electronic materials ordinarily used in the assembly of the packages themselves and the assembly of the packages onto the board. Reference numbers 1-18 refer to some electronic materials used in the packaging and assembly of semiconductors and printed circuit boards.

As noted above, provided herein is a consumer electronic article of manufacture. This article of manufacture (or "device") may be selected from notebook personal computers, tablet personal computers or handheld devices, for instance, music players, video players, still image players, game players, other media players, music recorders, video recorders, cameras, other media recorders, radios, medical equipment, domestic appliances, transportation vehicle instruments, musical instruments, calculators, cellular telephones, other wireless communication devices, personal digital assistants, remote controls, pagers, monitors, televisions, stereo equipment, set up boxes, set-top boxes, boom boxes, modems, routers, keyboards, mice, speakers, printers, and combinations thereof.

The device includes:

A housing comprising at least one substrate having an interior surface and an exterior surface;

A layer of thermally insulating elements disposed on at least a portion of the interior surface of the at least one substrate; and At least one semiconductor package comprising an assembly comprising at least one of I.
  a semiconductor chip;
  a heat spreader; and
  a thermal interface material therebetween, or
II.
  a heat spreader;
  a heat sink; and
  a thermal interface material therebetween.

The device may also include a venting element to disperse heat generated from the semiconductor assembly away from the device.

Of course, the consumer electronic device is provided with a power source to energize the semiconductor package(s).

The semiconductor package may be formed with a die attach material disposed between a semiconductor chip and a circuit board to securely adhere the chip to the board. Wire bonding forms the electrical interconnection between the chip and the board. This die attach material is oftentimes a highly filled material with a thermosetting resin matrix. The matrix may be composed of epoxy, maleimide, itaconimide, nadimide and/or (meth)acrylate. The filler may be conductive or non-conductive. In some instances, the die attach material is thermally conductive, in which case it too aids in dissipating heat away from the semiconductor package. Representative commercially available examples of such die attach materials include QMI519HT from Henkel Corporation.

Alternatively, the semiconductor package may be formed with a semiconductor chip electrically connected to a circuit board with solder interconnects in a space therebetween. In that space an underfill sealant may be disposed. The underfill sealant will also have a thermosetting matrix resin, which like the die attach material may be composed of epoxy, maleimide, itaconimide, nadimide and/or (meth)acrylate. The underfill sealant is ordinarily also filled. However, the filler is generally non-conductive and used for the purpose of accommodating differences in the coefficients of thermal expansion of the semiconductor die and the circuit board. Representative commercially available examples of such underfill sealants include HYSOL FP4549HT from Henkel Corporation.

Once the semiconductor package has been positioned onto the circuit board and attached thereto oftentimes by a surface mount adhesive, a chip bonder, or chip scale package underfill sealant, the package may be overmolded with mold compound in order to protect the package from among other things environmental contaminants. The mold compound is oftentimes epoxy or benzoxazine based. GR750 is an example of an epoxy mold compound, available commercially from Henkel Corporation, designed to improve thermal management in semiconductor devices.

Solder pastes are used at various portions on the circuit board to attach semiconductor packages and assemblies, in an electrically interconnected manner. One such solder paste is available commercially from Henkel Corporation under the tradename MULTICORE Bi58LM100. This lead free solder paste is designed for applications where thermal management is desirable.

To effectively manage the heat generated by semiconductor chips and semiconductor packages, a thermal interface material may be used with any heat-generating component for which heat dissipation is required, and in particular, for heat-generating components in semiconductor devices. In such devices, the thermal interface material forms a layer between the heat-generating component and the heat sink and transfers the heat to be dissipated to the heat sink. The thermal interface material may also be used in a device containing a heat spreader. In such a device, a layer of thermal interface material is placed between the heat-generating component and the heat spreader, and a second layer of thermal interface material is placed between the heat spreader and the heat sink.

The thermal interface material may be a phase change material, such as one commercially available from Henkel Corporation under the tradenames POWERSTRATE EXTREME, PowerstrateXtreme or PSX. Packaged as a freestanding film between two release liners and supplied as a die cut perform to match a wide variety of applications, this thermal interface material is a reworkable phase change material suitable for use for instance between a heat sink and variety heat dissipating components. The material flows at the phase change temperature, conforming to the surface features of the components. The thermal interface material when in the form of a phase change material has a melting point of approximately 51° C. or 60° C.

Upon flow, air is expelled from the interface, reducing thermal impedance, performing as a highly efficient thermal transfer material.

The thermal interface material may be constructed from (a) 60% to 90% by weight of paraffin; (b) 0% to 5% by weight of resin; and (c) 10% to 40% by weight of metal particle, such as an electrically-conductive filler. The electrically-conductive filler is ordinarily one selected from graphite, diamond, silver, and copper. Alternatively, the electrically-conductive filler may be aluminum, such as a spherical alumina.

The metal particles suitable for use in the thermal interface material may be fusible metal particles, typically low melting point metals or metal alloys used as solders. Examples of such metals include bismuth, tin, and indium, and may also include silver, zinc, copper, antimony, and silver coated boron nitride. In one embodiment the metal particles are selected from tin, bismuth, or both. In another embodiment, indium will also be present. Alloys of the above metals also can be used.

An eutectic alloy of tin and bismuth powder (melting point 138° C.), in a weight ratio of tin to bismuth of Sn48Bi52 may also be used, particularly in combination with indium powder (melting point 158° C.), in which the indium is present in a weight ratio of 1:1 with the Sn:Bi alloy.

The metal particles and/or alloys should be present in the composition in a range from 50 to 95 weight percent of the thermal interface material.

The thermal interface material may also be a thermal grease, such as one commercially available from Henkel Corporation under the trade designations TG100, COT20232-36I1 or COT20232-36E1. TG100 is a thermal grease designed for high-temperature heat transfer. In use, TG100 is placed between heat generating devices and the surfaces to which they are mounted or other heat dissipating surfaces. This product delivers excellent thermal resistance, offers high thermal conductivity and virtually no evaporation over a wide operating temperature range. In addition, COT20232-36E1 and COT20232-36I1 are TIM1 type materials, designed in this instance for high power flip chip applications. These products contain a soft gel polymer or curable matrix, which after cure forms an interpenetrating network with a low melting point alloy therewithin. The low melting point alloy may be fusible metal solder particles, particularly those substantially devoid of added lead, comprising an elemental solder powder and optionally a solder alloy.

The thermal interface material in use should have a thermal impedance of less than 0.2 (° C. cm$^2$/Watt).

The housing comprises at least two substrates and oftentimes a plurality of substrates. The substrates are dimensioned and disposed to engage one another.

Figure 2:
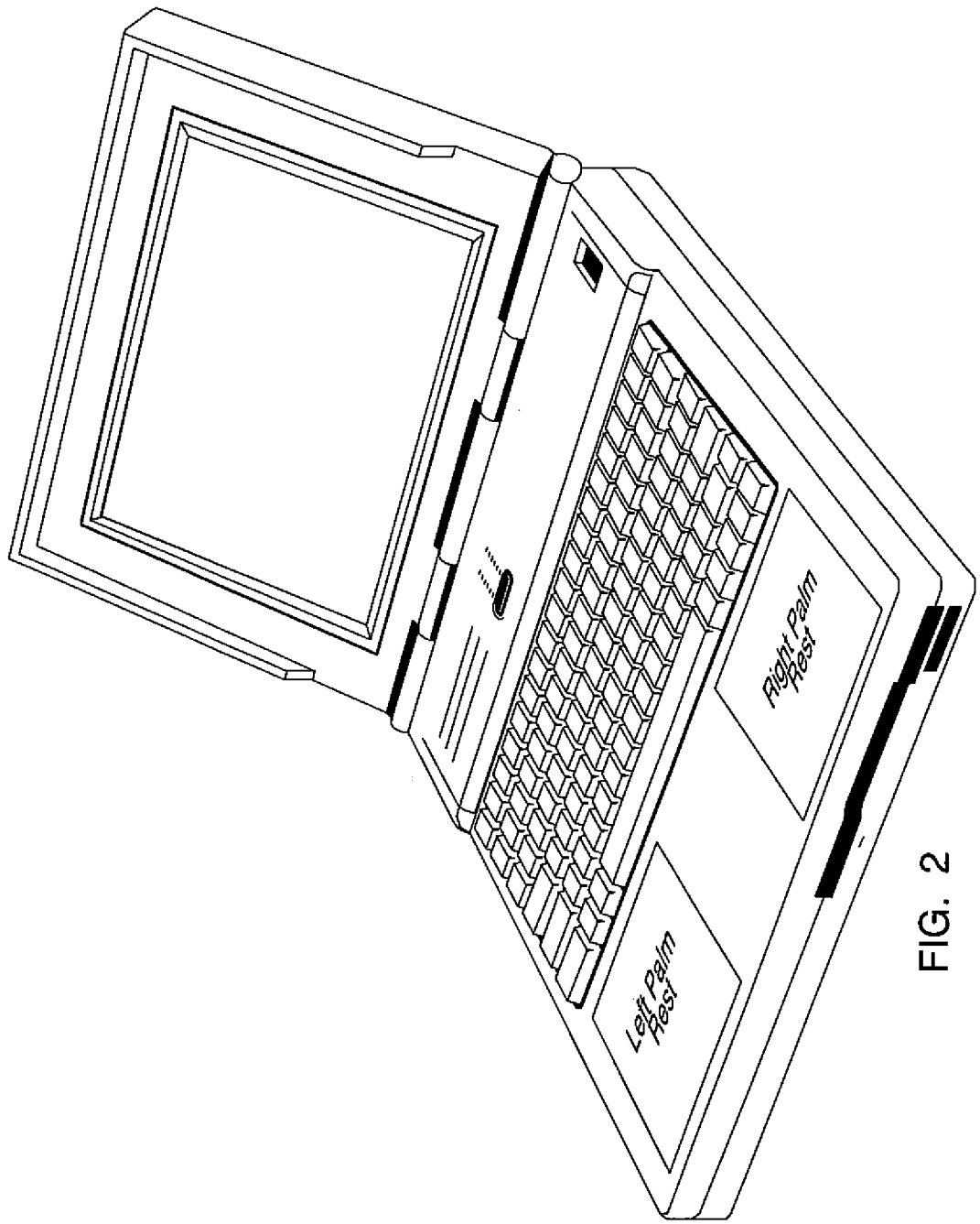
FIG. 2 depicts a laptop personal computer in the open position.
Figure 3:
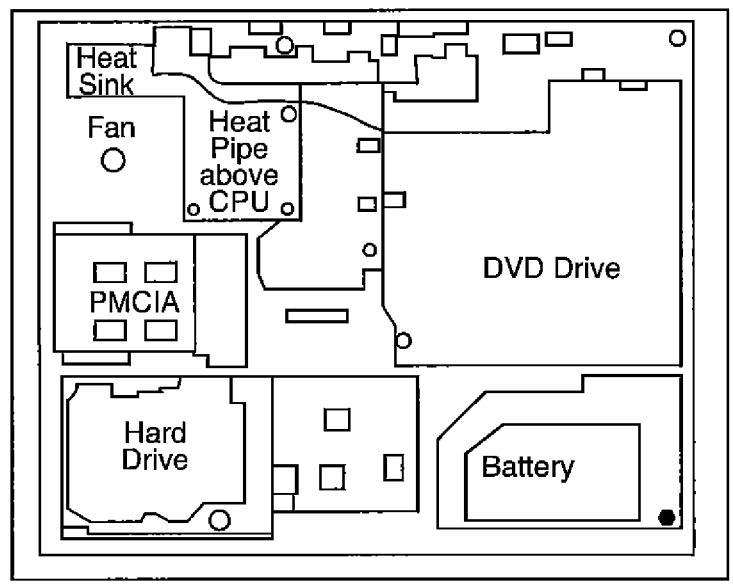
FIG. 3 depicts a top view of the contents of the laptop personal computer, beneath the keyboard and palm rests thereof.

The layer of thermally insulating elements is disposed on at least a portion of the interior surface of the at least one substrate that comprises the housing, the complementary exterior surface of which comes into contact with the end user when in use. So, with reference to FIG. 2, palm rests would be good examples of this location on a lap top or notebook personal computer. The thermally insulating elements may comprise a gas, such as air. The gas may be housed within a hollow sphere-like vessel.

Representative commercially available examples of such thermally insulating elements include those sold under the DUALITE tradename by Henkel Corporation or the EXPANCEL tradename by Akzo Nobel, such as DUALITE E. DUALITE E is promoted to lower the thermal conductivity of the final product in which it is used as cost reducing or weight saving component. Using DUALITE E is reported to introduce stable, hollow, closed-cell voids into the final product.

Prior to application the desired surface, the thermally insulating elements are contacted with a carrier vehicle, so as to form a suspension, dispersion or emulsion, at a concentration of 25% to 99% by volume in a liquid carrier vehicle. The carrier vehicle may be any liquid, though desirable ones carry no, or at most a low level of, environmental regulation and labeling requirements and should not cause or tend to cause agglomeration of the thermally insulating elements. The liquid carrier vehicle may be polar or non-polar. Water is a desirable carrier vehicle, as is lower alcohols. A polymeric emulsion may also be a desirable carrier vehicle.

The thermally insulating elements are applied to the surface in dispersion, suspension or emulsion form in a liquid carrier vehicle, such as by spraying. After application, the liquid carrier vehicle is removed under exposure to temperature conditions modestly higher than room temperature. The thermally insulating elements should form a coating on the surface of the substrate. The so-formed coating is thick enough to aid in creating a barrier to heat transmission through the substrate from the heat generated from the semiconductor packages when in use, but not so thick so as to interfere with the assembly and/or operation of the consumer electronic device.

With reference to FIG. 1, a cut way view of a circuit board is shown. On the circuit board is disposed a plurality of semiconductor packages and circuitry, together with electronic materials ordinarily used in the assembly of the packages themselves and the assembly of the packages onto the board, and a portion of the housing of the electronic device in which the circuit board is to be used. In FIG. 1, 1 refers to surface mount adhesives (such as LOCTITE 3609 and 3619); 2 refers to thermal interface materials, as described in more detail herein; 3 refers to low pressure molding materials (such as MM6208); 4 refers to flip chip on board underfill such as HYSOL FP4531); 5 refers to liquid encapsulants glob top (such as HYSOL E01016 and E01072); 6 refers to silicone encapsulants (such as LOCTITE 5210); 7 refers to gasketing compounds (such as LOCTITE 5089); 8 refers to a chip scale package/ball grid array underfill (such as HYSOL UF3808 and E1216); 9 refers to a flip chip air package underfill (such as HYSOL FP4549 HT); 10 refers to coating powder (such as HYSOL DK7-0953M); 11 refers to mechanic molding compound (such as HYSOL LL-1000-3NP and GR2310); 12 refers to potting compound (such as E&C 2850FT); 13 refers to optoelectronic (such as Ablestik AA50T); 14 refers to die attach (such as Ablestick 0084-1LM1SR4, 8290 and HYSOL OMI529HT); 15 refers to conformal coating (such as LOCTITE 5293 and PC40-UMF); 16 refers to photonic component and assembly materials (such as STYLAST 2017M4 and HYSOL OTO149-3); 17 refers to semiconductor mold compound; and 18 refers to solder (such as Multicore BI58LM100AAS90V and 97SCLF318AGS88.5). Each of these products is available for sale commercially from Henkel Corporation, Irvine, Calif.

The circuit board A of FIG. 1 is disposed within the interior of the housing of an electronic device (not shown). On at least a portion of an inwardly facing surface of a substrate which comprises the housing of the electronic device is coated a layer of thermally insulating elements (not shown).

Figure 4:
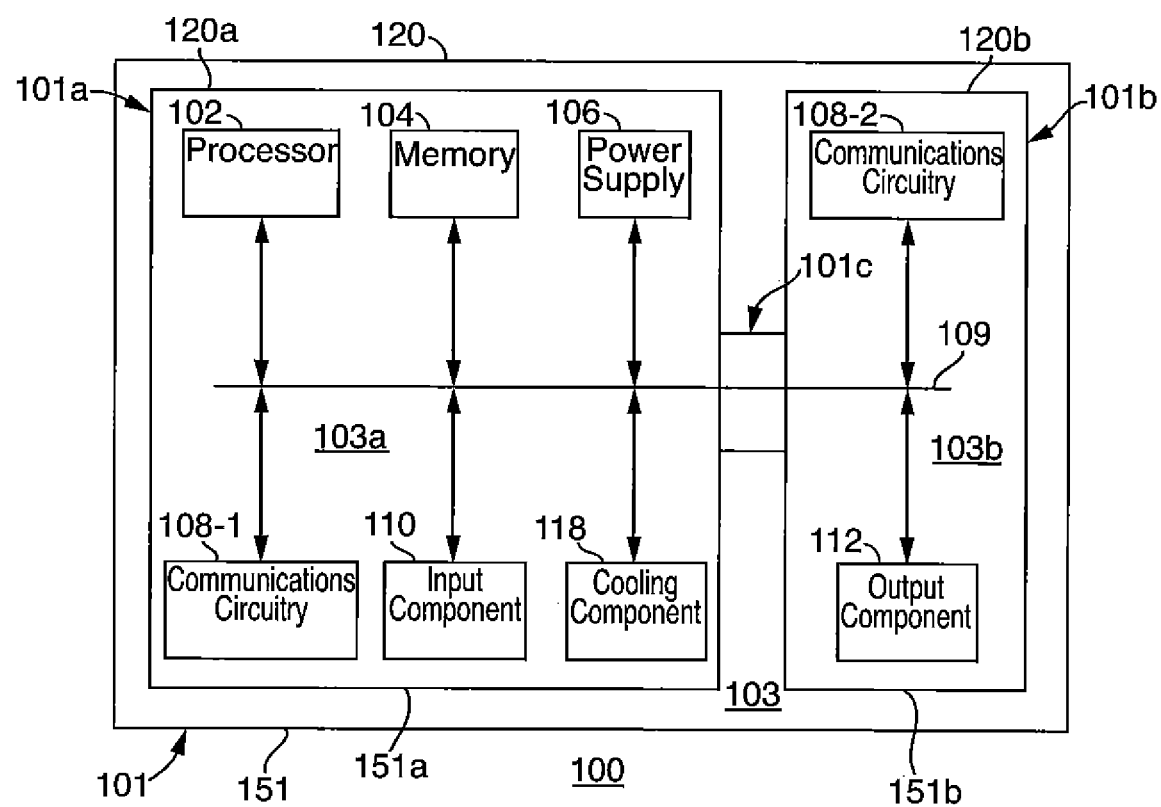
FIG. 4 depicts a general schematic diagram of an electronic device.

As shown in FIG. 4, electronic device 100 may include housing 101, processor 102, memory 104, power supply 106, communications circuitry 108-1, bus 109, input component 110, output component 112, and cooling component 118. Bus 109 may include one or more wired or wireless links that provide paths for transmitting data and/or power, to, from, or between various components of electronic device 100 including, for example, processor 102, memory 104, power supply 106, communications circuitry 108-1, input component 110, output component 112, and cooling component 118.

Memory 104 may include one or more storage mediums, including, but not limited to, a hard-drive, flash memory, permanent memory such as read-only memory ("ROM"), semi-permanent memory such as random access memory ("RAM"), any other suitable type of storage component, and any combinations thereof. Memory 104 may include cache memory, which may be one or more different types of memory used for temporarily storing data for electronic device applications.

Power supply 106 may provide power to the electronic components of electronic device 100, either by one or more batteries or from a natural source, such as solar power using solar cells).

One or more input components 110 may be provided to permit a user to interact or interface with device 100, such as by way of an electronic device pad, dial, click wheel, scroll wheel, touch screen, one or more buttons (e.g., a keyboard), mouse, joy stick, track ball, microphone, camera, video recorder, and any combinations thereof.

One or more output components 112 can be provided to present information (e.g., textual, graphical, audible, and/or tactile information) to a user of device 100, such as by way of audio speakers, headphones, signal line-outs, visual displays, antennas, infrared ports, rumblers, vibrators, and any combinations thereof.

One or more cooling components 118 can be provided to help dissipate heat generated by the various electronic components of electronic device 100. These cooling components 118 may take various forms, such as fans, heat sinks, heat spreaders, heat pipes, vents or openings in housing 101 of electronic device 100, and any combinations thereof.

Processor 102 of device 100 may control the operation of many functions and other circuitry provided by device 100. For example, processor 102 can receive input signals from input component 110 and/or drive output signals through output component 112.

Housing 101 should provide at least a partial enclosure to one or more of the various electronic components that operate electronic device 100. Housing 100 protects the electronic components from debris and other degrading forces external to device 100. Housing 101 may include one or more walls 120 that define a cavity 103 within which various electronic components of device 100 can be disposed. Housing openings 151 may also allow certain fluids (e.g., air) to be drawn into and discharged from cavity 103 of electronic device 100 for helping to manage the internal temperature of device 100. Housing 101 can be constructed from a variety of materials, such as metals (e.g., steel, copper, titanium, aluminum, and various metal alloys), ceramics, plastics, and any combinations thereof.

Rather than being provided as a single enclosure, housing 101 may also be provided as two or more housing components. Processor 102, memory 104, power supply 106, communications circuitry 108-1, input component 110, and cooling component 118 may be at least partially contained within a first housing component 101a, for instance, while output component 112 may be at least partially contained within a second housing component 101b.

EXAMPLE

The following components were placed in a vessel with stirring: an acrylic emulsion (CARBOTAC1811), 30%; Surfactant (PLURONIC P84), 3%, Defoamer (BYK019), 1%; Unexpanded DUALITE (U020-125W), 10%; and Water, 56%.

The mixture was stirred for a period of time of 60 minutes to disperse the DUALITE polymer particles. The mixture was then sprayed on a substrate and dried at a temperature of 100° C. for a period of time of 30 minutes to produce a tacky pressure sensitive adhesive ("PSA") film.

A 0.03 mm coating of the PSA film was placed on a test die, and exposed to a temperature of 50° C. to produce a 5.5° C. temperature drop. A film prepared in a similar manner though without the DUALITE polymer particles and likewise placed on a test die produced a 2° C. temperature drop.

A 0.1 mm coating of the PSA-A was placed on a test die, and exposed to a temperature of 50° C. to produce a 6.8° C. temperature drop.

The following components were placed in a vessel with stirring: Acrylic emulsion (HYCAR 26138), 30%; Surfactant (PLURONIC P84), 3%; Defoamer (BYK019), 1%; DUALITE (E135-040D), 10%, and Water, 56%.

The mixture was stirred for a period of time of 60 minutes to disperse the DUALITE polymer particles. The mixture was then sprayed on a substrate and dried at a temperature of 85° C. for a period of time of 10 minutes, to produce a non-tacky film. The non-tacky film showed thermal conductivity of about 0.1 w/mC. A 0.1 mm coating of the non-tacky film was placed on a test die, and exposed to a temperature of at 50° C. to produce a 8° C. temperature drop.

What is claimed is:

1. A consumer electronic article of manufacture comprising:
    (A) A housing comprising at least one substrate having an interior surface and an exterior surface;
    (B) A layer of thermally insulating elements disposed on at least a portion of the interior surface of the at least one substrate, wherein the thermally insulating elements comprises a gas within a hollow sphere-like vessel; and
    (C) At least one semiconductor package comprising an assembly comprising at least one of
    I.
        a semiconductor chip;
        a heat spreader; and
        a thermal interface material therebetween, or
    II.
        a heat spreader;
        a heat sink; and
        a thermal interface material therebetween.

2. The article of manufacture of claim 1, wherein the thermally insulating elements are used at a concentration within the range of 25% to 99% by volume in a liquid carrier vehicle.

3. The article of manufacture of claim 1, wherein the thermally insulating elements are applied to the surface in dispersion or a suspension in a liquid carrier vehicle.

4. The article of manufacture of claim 1, wherein the thermally insulating elements are applied to the surface in a dispersion or a suspension in a liquid carrier vehicle comprising water.

5. The article of manufacture of claim 1, wherein the thermally insulating elements are applied to the surface in a dispersion or a suspension in a liquid carrier vehicle comprising polymeric emulsions.

6. The article of manufacture of claim 1, wherein the thermal interface material comprises a thermally-conductive composition for facilitating the transfer of heat from an electronic component to a heat sink comprising:
    (a) 60% to 90% by weight of paraffin;
    (b) 0% to 5% by weight of resin; and
    (c) 10% to 40% by weight of an electrically-conductive filler.

7. The article of manufacture of claim 6, wherein the electrically-conductive filler is selected from the group consisting of graphite, diamond, silver, copper and alumina.

8. The article of manufacture of claim 6, wherein the composition has a melting point of approximately 51° C.

9. The article of manufacture of claim 6, wherein the composition has a melting point of approximately 60° C.

10. The article of manufacture of claim 1, wherein the thermal interface material has a thermal impedance (° C. cm$^2$/Watt) of less than 0.2.

11. The article of manufacture of claim 1, further comprising a venting element to disperse generated heat from the semiconductor assembly from the article.

12. The article of manufacture of claim 1, wherein the housing comprises at least two substrates.

13. The article of manufacture of claim 1, wherein the housing comprises a plurality of substrates.

14. The article of manufacture of claim 1, wherein the substrates are dimensioned and disposed to engage one another.

15. The article of manufacture of claim 1, wherein the layer of thermally insulating elements is disposed on at least a portion of the interior surface of the at least one substrate, the complementary exterior surface of which comes into contact with the end user when in use.

16. The article of manufacture of claim 1, wherein the gas within the hollow sphere-like vessel comprises air.

17. The article of manufacture of claim 1, wherein the thermal interface material comprises a phase change material.

18. The article of manufacture of claim 1, wherein the thermal interface material comprises thermal grease.

19. The article of manufacture of claim 1, wherein the thermal interface material comprises a curable matrix material; fusible metal solder particles substantially devoid of added lead, comprising an elemental solder powder and optionally a solder alloy; and optionally, a catalyst.

20. The article of manufacture of claim 1, wherein the article is a notebook personal computer, tablet personal computer or a handheld device.

* * * * *